United States Patent
Dhindsa

(10) Patent No.: US 9,064,909 B2
(45) Date of Patent: Jun. 23, 2015

(54) METHOD OF PROCESSING A SEMICONDUCTOR SUBSTRATE IN A PLASMA PROCESSING APPARATUS

(71) Applicant: Lam Research Corporation, Fremont, CA (US)

(72) Inventor: Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 13/919,635

(22) Filed: Jun. 17, 2013

(65) Prior Publication Data

US 2013/0280914 A1 Oct. 24, 2013

Related U.S. Application Data

(62) Division of application No. 13/403,266, filed on Feb. 23, 2012, now Pat. No. 8,484,846, which is a division of application No. 12/222,778, filed on Aug. 15, 2008, now Pat. No. 8,147,648.

(51) Int. Cl.
*H05K 3/20* (2006.01)
*H01L 21/67* (2006.01)
(Continued)

(52) U.S. Cl.
CPC ..... *H01L 21/67069* (2013.01); *Y10T 29/49959* (2015.01); *Y10T 29/49401* (2015.01); *Y10T 156/10* (2015.01); *Y10T 29/4913* (2015.01); *Y10T 29/49769* (2015.01); *Y10T 29/49428* (2015.01); *Y10T 29/49002* (2015.01); *Y10T 29/49895* (2015.01); *H01J 37/3244* (2013.01);
(Continued)

(58) Field of Classification Search
USPC .......... 29/829, 831, 832, 841, 846, 848, 851, 29/855, 858, 88; 118/715, 722, 723 E, 118/723 R; 156/345.33, 345.34, 156/345.43–345.47

See application file for complete search history.

(56) References Cited

U.S. PATENT DOCUMENTS

| 5,569,356 A | 10/1996 | Lenz et al. |
| 6,073,577 A | 6/2000 | Lilleland et al. |

(Continued)

FOREIGN PATENT DOCUMENTS

| EP | 1884979 A2 | 2/2008 |
| JP | 6-333878 A | 12/1994 |

(Continued)

OTHER PUBLICATIONS

International Search Report and Written Opinion mailed Mar. 19, 2010 for PCT/US2009/004495.

(Continued)

*Primary Examiner* — Paul D Kim
(74) *Attorney, Agent, or Firm* — Buchanan Ingersoll & Rooney PC

(57) ABSTRACT

A showerhead electrode for a plasma processing apparatus includes an interface gel between facing surfaces of an electrode plate and a backing plate. The interface gel maintains thermal conductivity during lateral displacements generated during temperature cycling due to mismatch in coefficients of thermal expansion. The interface gel comprises, for example, a silicone based composite filled with aluminum oxide microspheres. The interface gel can conform to irregularly shaped features and maximize surface contact area between mating surfaces. The interface gel can be pre-applied to a consumable upper electrode.

15 Claims, 12 Drawing Sheets

(51) Int. Cl.
*H01J 37/32* (2006.01)
*C23C 16/455* (2006.01)
*C23C 16/509* (2006.01)

(52) U.S. Cl.
CPC ....... *C23C 16/45565* (2013.01); *C23C 16/5096* (2013.01); *H01J 37/32091* (2013.01); *H01J 37/32449* (2013.01); *H01J 37/32541* (2013.01); *H01J 37/32605* (2013.01)

(56) References Cited

U.S. PATENT DOCUMENTS

| | | | |
|---|---|---|---|
| 6,468,925 B2 | 10/2002 | Campbell et al. | |
| 6,514,347 B2 | 2/2003 | Denpoh | |
| 6,753,498 B2 | 6/2004 | Sirkis et al. | |
| 6,786,175 B2 | 9/2004 | Dhindsa et al. | |
| 6,818,097 B2 | 11/2004 | Yamaguchi et al. | |
| 6,827,815 B2 | 12/2004 | Hytros et al. | |
| 7,159,537 B2 | 1/2007 | Wickramanayaka et al. | |
| 7,645,341 B2 | 1/2010 | Kennedy et al. | |
| 7,677,480 B2 | 3/2010 | Russell et al. | |
| 7,854,820 B2 | 12/2010 | de la Llera et al. | |
| 7,861,667 B2 | 1/2011 | Fischer et al. | |
| 8,206,506 B2 | 6/2012 | Kadkhodayan et al. | |
| 8,221,582 B2 * | 7/2012 | Patrick et al. | 156/345.34 |
| 8,317,968 B2 | 11/2012 | Dhindsa et al. | |
| 8,418,649 B2 | 4/2013 | Larson et al. | |
| 8,449,679 B2 | 5/2013 | Dhindsa | |
| 8,449,786 B2 | 5/2013 | Larson et al. | |
| 8,484,846 B2 | 7/2013 | Dhindsa | |
| 8,679,288 B2 * | 3/2014 | Stevenson et al. | 156/345.43 |
| 8,702,866 B2 | 4/2014 | Augustino et al. | |
| 2002/0127853 A1 | 9/2002 | Hubacek et al. | |
| 2003/0032301 A1 * | 2/2003 | Dhindsa et al. | 438/758 |
| 2005/0133160 A1 * | 6/2005 | Kennedy et al. | 156/345.34 |
| 2006/0051517 A1 | 3/2006 | Haas et al. | |
| 2007/0068629 A1 | 3/2007 | Shih et al. | |
| 2009/0305509 A1 | 12/2009 | Stevenson et al. | |
| 2010/0003829 A1 * | 1/2010 | Patrick et al. | 438/758 |
| 2010/0304571 A1 * | 12/2010 | Larson et al. | 438/710 |
| 2012/0258603 A1 * | 10/2012 | Patrick et al. | 438/758 |

FOREIGN PATENT DOCUMENTS

| | | |
|---|---|---|
| JP | 2002-231637 A | 8/2002 |
| KR | 10-2008-0005116 A | 1/2008 |

OTHER PUBLICATIONS

European Search Report mailed Jul. 4, 2013 for European Application No. 09806941.2.

Notification of Examination Opinions issued Jan. 14, 2015 for Taiwan Patent Appln. No. 98127374.

* cited by examiner

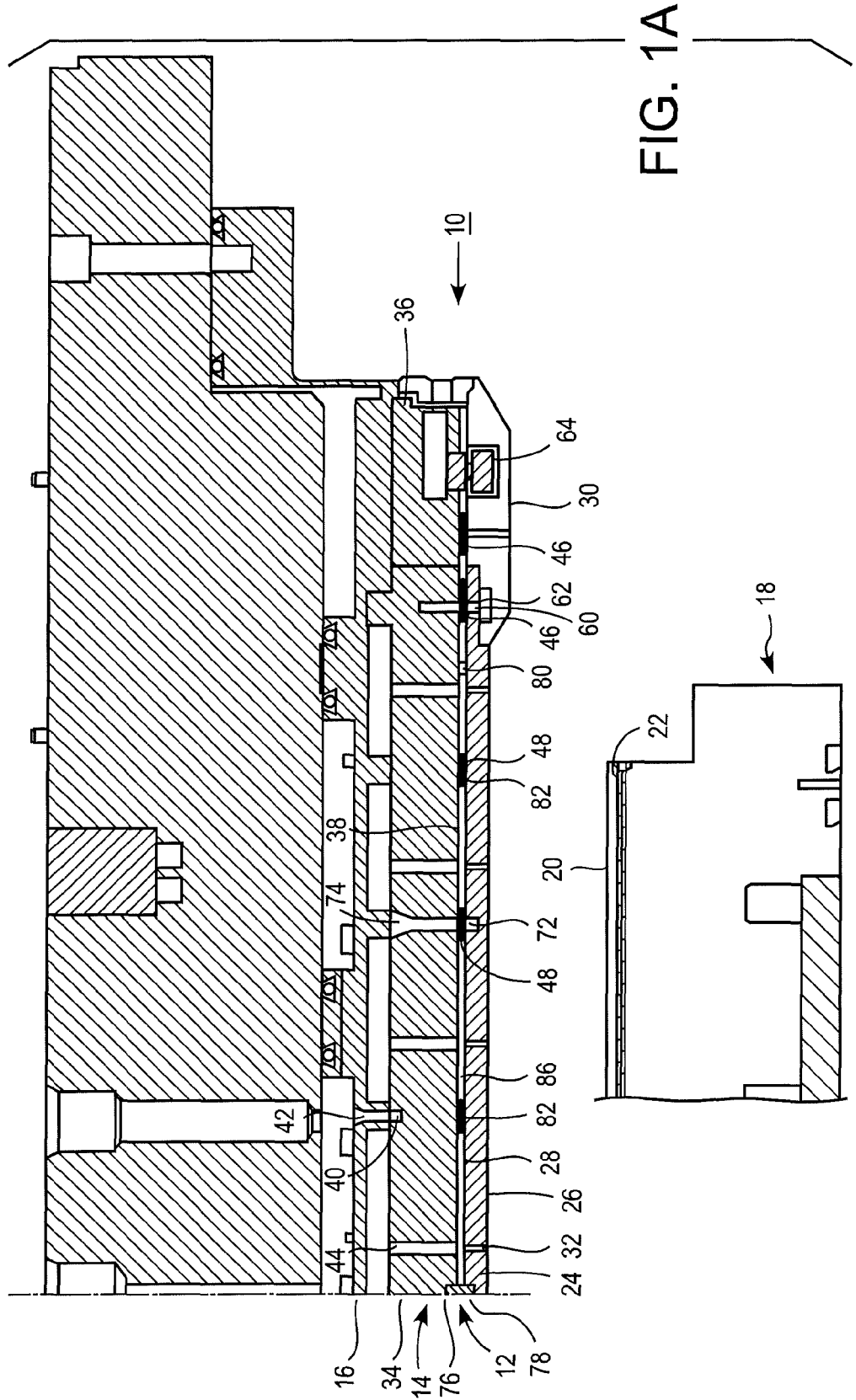

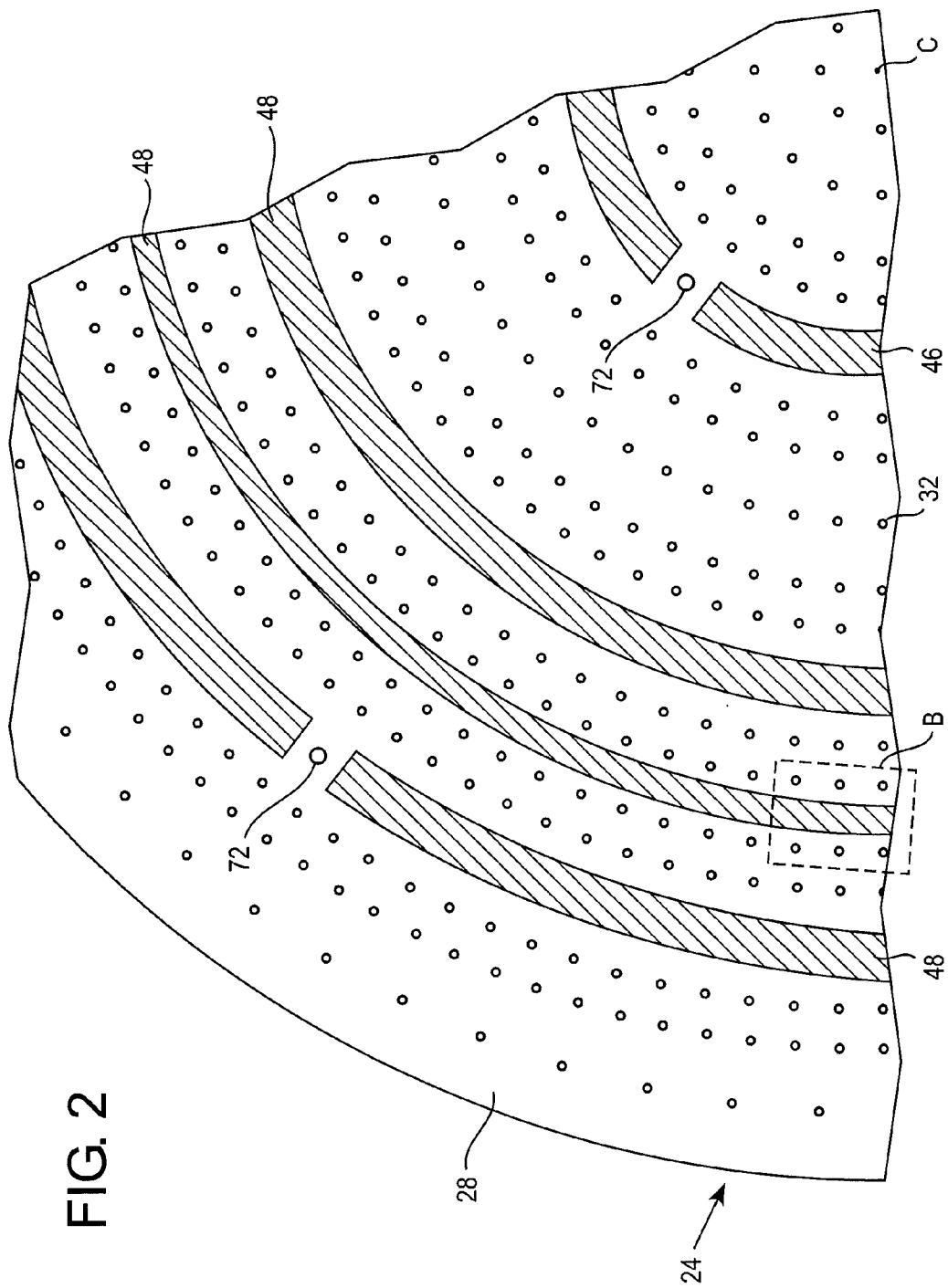

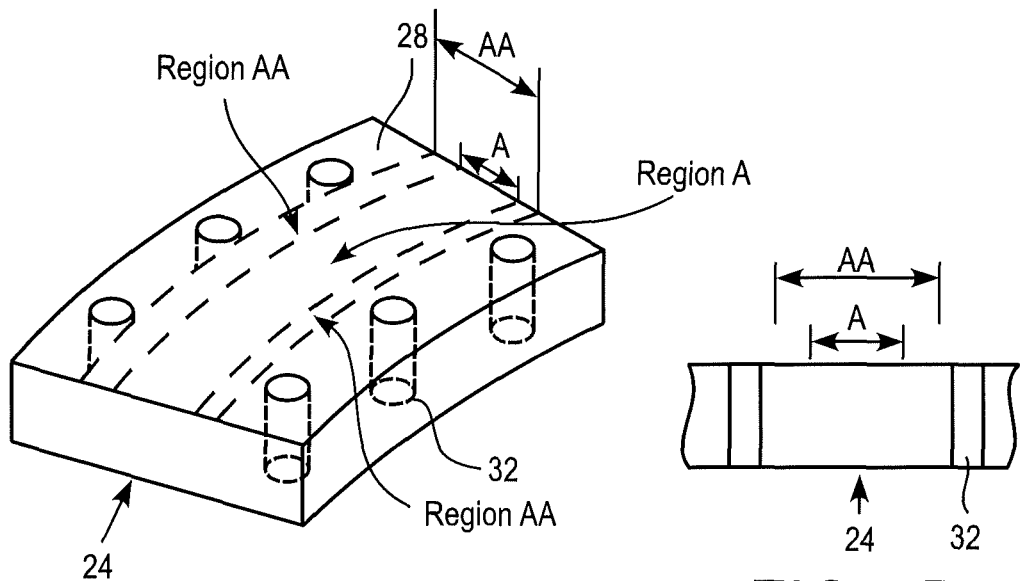
FIG. 3A
FIG. 3B
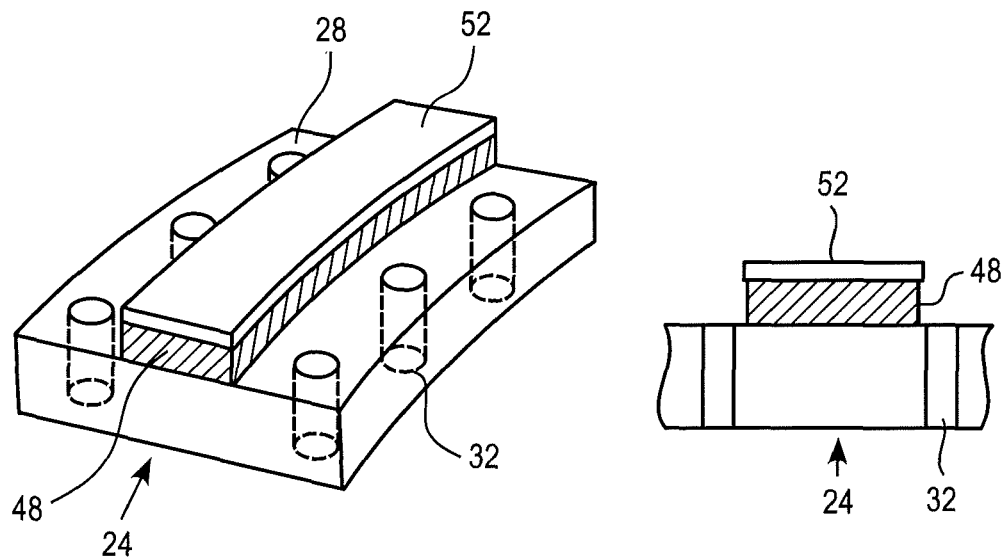
FIG. 4A
FIG. 4B

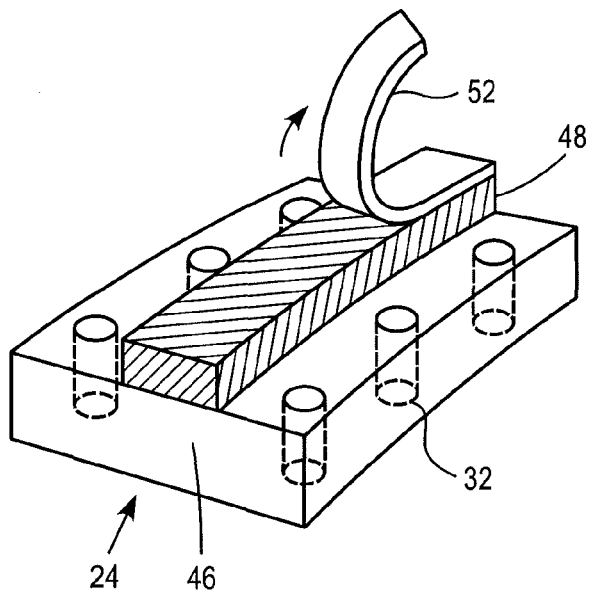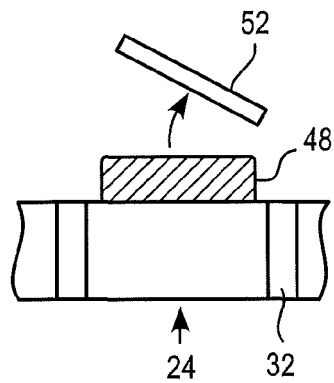
FIG. 5A    FIG. 5B
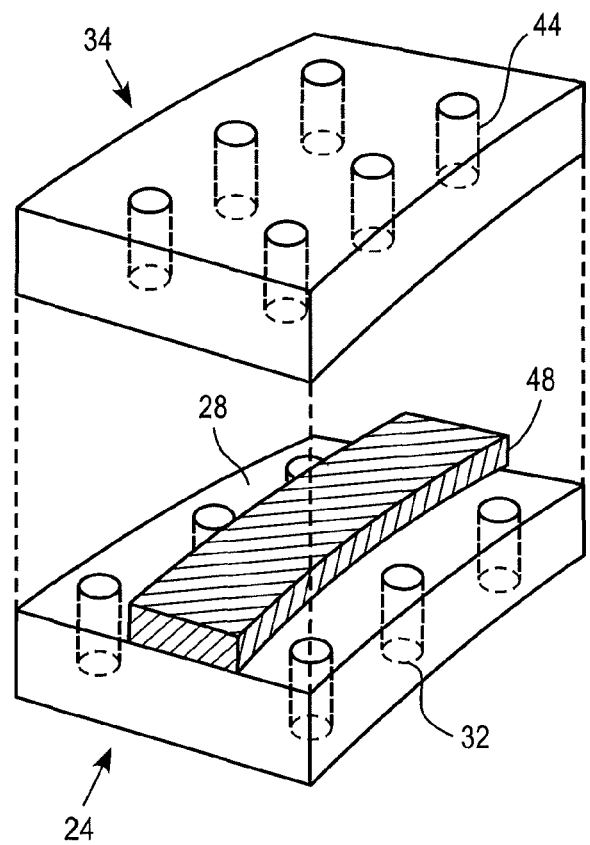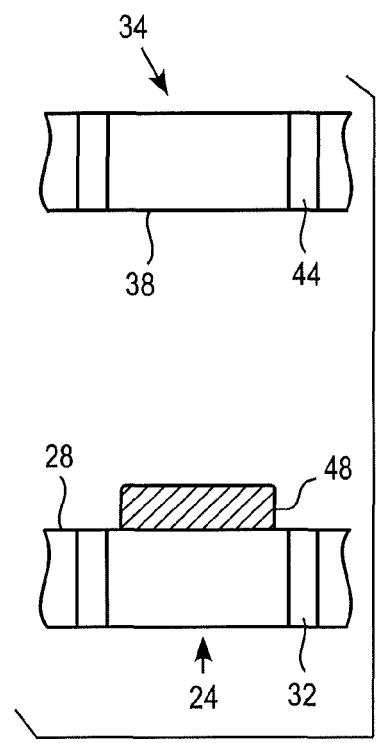
FIG. 6A    FIG. 6B

METHOD OF PROCESSING A SEMICONDUCTOR SUBSTRATE IN A PLASMA PROCESSING APPARATUS

This is a division of application Ser. No. 13/403,266 filed Feb. 23, 2012, now U.S. Pat. No. 8,484,846, which is a division of application Ser. No. 12/222,778 filed Aug. 15, 2008, now U.S. Pat. No. 8,147,648.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

In an embodiment, a composite showerhead electrode assembly for generating plasma in a plasma processing apparatus is provided. The composite showerhead electrode assembly includes a backing plate comprising top and bottom surfaces with first gas passages therebetween, the bottom surface having bridged and unbridged regions, the first gas passages having outlets in unbridged regions to supply a process gas to an interior of the plasma processing apparatus, an electrode plate having a top surface, a plasma exposed bottom surface, and second gas passages extending therebetween and in fluid communication with the first gas passages, wherein the second gas passages have inlets in unbridged regions of the top surface of the electrode plate, and an interface gel disposed between facing surfaces of at least one of the bridged regions which establishes thermal contact between the electrode plate and the backing plate and maintains the thermal contact during movement in a lateral direction of the electrode plate relative to the backing plate during temperature cycling due to mismatch of coefficients of thermal expansion in the electrode plate and the backing plate, wherein the electrode plate is joined to the backing plate to allow the lateral movement.

In another embodiment, a method of joining components for a composite showerhead electrode assembly for a plasma processing apparatus is provided. The method includes applying the interface gel to the top surface of the electrode plate in a predetermined pattern within bridging regions, aligning the bottom surface of a backing plate with the top surface of the electrode plate; and attaching the top surface of the electrode plate to the bottom surface of the backing plate with a clamp or adhesive bond, wherein the interface gel is spread laterally into bridging regions between the top surface of the electrode plate and the bottom surface of the backing plate, and the gas passages of the backing plate are in fluid communication with the gas passages of the electrode plate.

Another embodiment provides a method of processing a semiconductor substrate in a plasma processing apparatus. A substrate is placed on a substrate support in a reaction chamber of a plasma processing apparatus. A process gas is introduced into the reaction chamber with the composite showerhead electrode assembly. A plasma is generated from the process gas in the reaction chamber between the showerhead electrode assembly and the substrate. The substrate is processed with the plasma.

In still another embodiment, an electrode plate for generating a plasma in a plasma processing apparatus, includes a top surface to be assembled to a backing plate bottom surface, a plasma exposed bottom surface, and gas passages extending therebetween; and an interface gel disposed on the top surface in a predetermined pattern within bridging regions, the gas passages having inlets in unbridged regions.

BRIEF DESCRIPTION OF THE DRAWINGS

FIG. 1A illustrates a cross-sectional view of a portion of an embodiment of a composite showerhead electrode assembly and a substrate support for a plasma processing apparatus.

FIG. 2 is a partial top view of an embodiment of an inner electrode member, illustrating the application of an interface gel in a predetermined pattern in relation to gas passages.

FIGS. 3A-5A illustrate three-dimensional perspective views of a portion of the showerhead electrode assembly of FIG. 2, illustrating the application of the interface gel.

FIGS. 3B-5B illustrate cross-sectional views of a portion of the showerhead electrode assembly of FIG. 2, illustrating the application of the interface gel.

FIGS. 6A and 6B show perspective and cross-sectional views respectively, of the portion of the inner electrode member of FIG. 2, illustrating the application of the interface gel shown in FIGS. 5A and 5B and an embodiment of a backing plate aligned to be joined to the inner electrode member.

DETAILED DESCRIPTION

Control of particulate contamination on the surfaces of semiconductor wafers during the fabrication of integrated circuits is essential in achieving reliable devices and obtaining a high yield. Processing equipment, such as plasma processing apparatuses, can be a source of particulate contamination. For example, the presence of particles on the wafer surface can locally disrupt pattern transfer during photolithography and etching steps. As a result, these particles can introduce defects into critical features, including gate structures, intermetal dielectric layers or metallic interconnect lines, resulting in the malfunction or failure of the integrated circuit component.

Reactor parts with relatively short lifetimes are commonly referred to as "consumables," for example, silicon electrodes. If the consumable part's lifetime is short, then the cost of ownership is high. Silicon electrode assemblies used in dielectric etch tools deteriorate after a large number of RF hours (time in hours during which radio frequency power is used to generate the plasma). Erosion of consumables and other parts generates particulate contamination in plasma processing chambers.

Showerhead electrode assemblies can be fabricated by joining two or more dissimilar members with mechanically compliant and/or thermally conductive bonding materials, allowing for a multiplicity of function. The use of mechanical clamping for joining together surfaces of an electrode assembly is described, for example, in commonly-owned U.S. Pat. No. 5,569,356, which is incorporated herein by reference in its entirety. The use of elastomers for bonding together surfaces of an electrode assembly is described, for example, in commonly-owned U.S. Pat. No. 6,073,577 and co-pending U.S. Provisional Pat. Appl. No. 61/008,152 filed Dec. 19, 2007 and 61/008,144 filed Dec. 19, 2007, which are incorporated herein by reference in their entirety. In the instance of elastomeric bonds, the bonding material can contain electrically and/or thermally conductive filler particles to enhance electrical or thermal conductivity. Examples of methods for enhancing thermal and electrical conductivity between components of a plasma processing apparatus are provided.

Figure 1B:
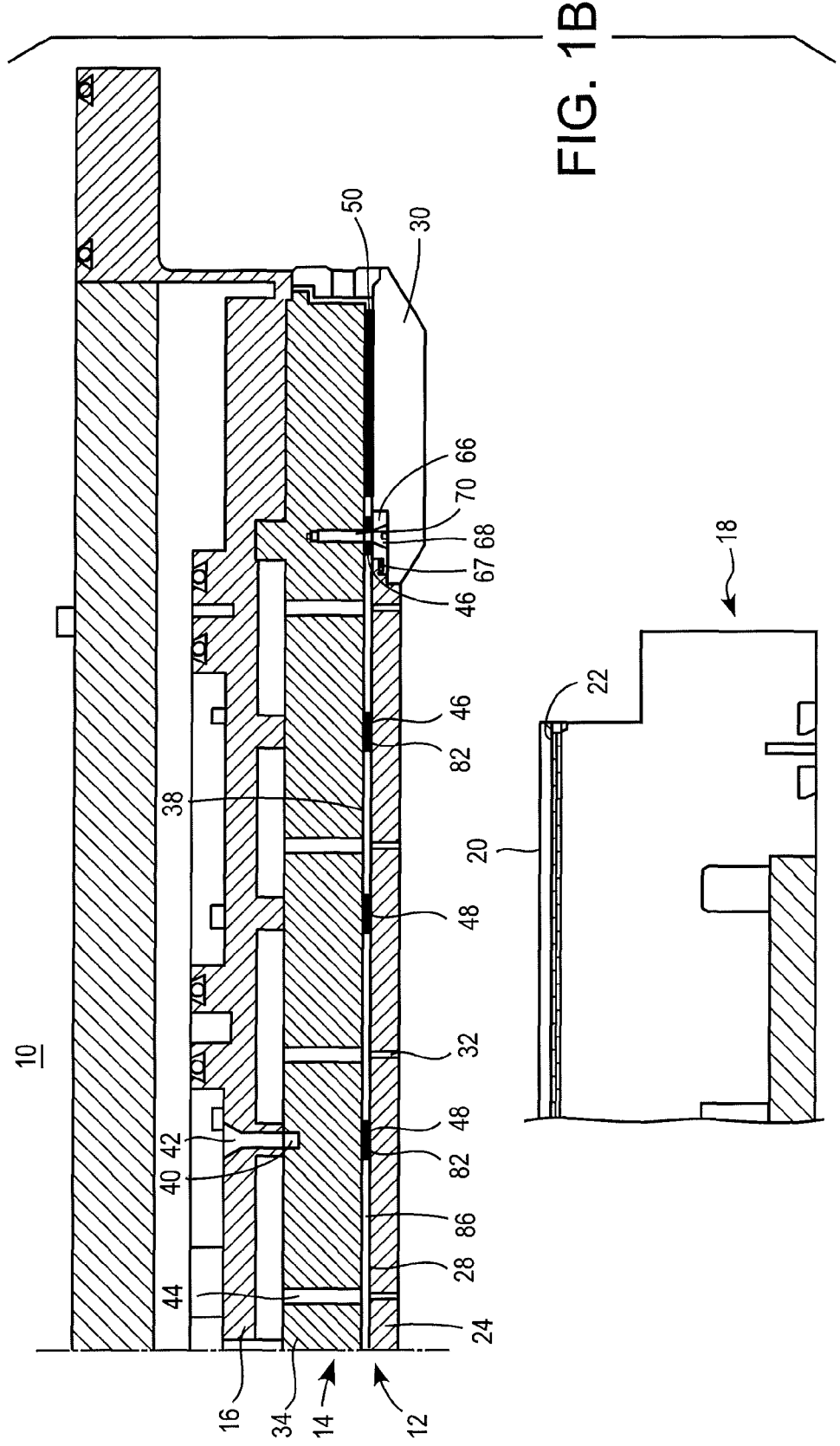
FIG. 1B illustrates a cross-sectional view of a portion of another embodiment of a composite showerhead electrode assembly and a substrate support for a plasma processing apparatus.

FIG. 1A illustrates an exemplary embodiment of a showerhead electrode assembly 10 for a plasma processing apparatus in which semiconductor substrates, e.g., silicon wafers, are processed. The showerhead electrode assembly 10 comprises a showerhead electrode including an upper electrode 12, a temperature controlled backing member 14 secured to the upper electrode 12, and a thermal control plate 16. A substrate support 18 (only a portion of which is shown in FIG. 1A), including a bottom electrode and optional electrostatic clamping electrode, is positioned beneath the upper electrode 12 in the vacuum processing chamber of the plasma processing apparatus. A substrate 20 subjected to plasma processing is mechanically or electrostatically clamped on an upper support surface 22 of the substrate support 18.

In the illustrated embodiment, the upper electrode 12 of the showerhead electrode includes an inner electrode member 24, and an optional outer electrode member 30. The inner electrode member 24 is preferably a cylindrical plate (e.g., a plate composed of silicon) and includes plasma-exposed bottom surface 26 and top surface 28. The inner electrode member 24 can have a diameter smaller than, equal to, or larger than a wafer to be processed (e.g., up to about 8 inches (about 200 mm) or up to about 12 inches (about 300 mm) if the plate is made of silicon). In a preferred embodiment, the showerhead electrode assembly 10 is large enough for processing large substrates, such as semiconductor wafers having a diameter of 300 mm or larger. For 300 mm wafers, the upper electrode 12 is at least 300 mm in diameter and preferably about 12 to 15 inches in diameter. However, the showerhead electrode assembly can be sized to process other wafer sizes or substrates having a non-circular configuration. In the illustrated embodiment, the inner electrode member 24 is wider than the substrate 20.

For processing 300 mm wafers, the outer electrode member 30 is provided to expand the diameter of the upper electrode 12 to about 15 inches to about 17 inches. The outer electrode member 30 can be a continuous member (e.g., a continuous poly-silicon ring), or a segmented member (e.g., including 2-6 separate segments arranged in a ring configuration, such as segments composed of silicon). In embodiments of the upper electrode 12 that include a multiple-segment, outer electrode member 30, the segments preferably have edges, which overlap each other to protect an underlying bonding material from exposure to plasma. The inner electrode member 24 preferably includes a pattern or array of gas passages 32 extending through the backing member 14 for injecting process gas into a space in a plasma reaction chamber located between the upper electrode 12 and the bottom electrode 18. Optionally, the outer electrode member 30 also includes a pattern or array of gas passages (not shown) extending through a backing ring 36 of the backing member 14 for injecting process gas into the space in the plasma reaction chamber located between the upper electrode 12 and the bottom electrode 18.

Silicon is a preferred material for plasma exposed surfaces of the inner electrode member 24 and the outer electrode member 30. Both electrodes are preferably made of high-purity, single crystal silicon, which minimizes contamination of substrates during plasma processing and also wears smoothly during plasma processing, thereby minimizing particles. Alternative materials that can be used for plasma-exposed surfaces of the upper electrode 12 include SiC or AlN, for example.

In the illustrated embodiment, the backing member 14 includes a backing plate 34 and a backing ring 36, extending around the periphery of the backing plate 34. The backing plate 34 includes a bottom surface 38. In the embodiment, the inner electrode member 24 is co-extensive with the backing plate 34, and the outer electrode member 30 is co-extensive with the surrounding backing ring 36. However, the backing plate 34 can extend beyond the inner electrode member 24 such that a single backing plate can be used to support the inner electrode member 24 and the segmented or continuous outer electrode member 30. The upper electrode 12 is secured to the backing member 14 with fasteners such as screws or a clamp ring around the periphery, by a bonding material or the like.

Fastener members 60 are shown in the embodiment of FIG. 1A attaching the periphery of the inner electrode member 24 to the backing plate 34. The fastener members 60 pass through a plurality of holes 62 around the periphery of the inner electrode member 24 and attach the inner electrode member 24 to the backing plate 34. The outer electrode member 30 preferably overlaps the periphery of the inner electrode member 24, the plurality of fastener holes 62 and the inner electrode fastener members 60. Outer electrode cam locks 64 secure the outer electrode member 30 to the backing plate. Details of the cam locks are described in commonly owned U.S. Provisional Application 61/036,862 filed Mar. 14, 2008, which is incorporated herein by reference in its entirety.

Preferably a plurality of alignment pin holes 72 in the top surface 28 of the inner electrode member 24 are aligned with a plurality of corresponding alignment pin holes 74 in the backing plate 34. Polymer pins or fasteners received in the alignment holes 72/74 can be used to align the inner electrode member 24 to the backing plate 34. Optionally such alignment holes and pins (not shown) are also located in the outer electrode member 30 and the backing ring 36 to align these components. Optionally, such alignment holes 72/74 can be aligned optically. In one embodiment, alignment markings (not shown) can be aligned optically, where alignment holes may be undesired.

Preferably, in bridged regions 82 between the top surface 28 of the inner electrode member 24 and the bottom surface 38 of the backing plate 34, an interface gel 48 is disposed. The interface gel 48 provides a thermally conductive interface between the inner electrode member 24 and the backing plate 34. Also, the interface gel can provide an electrically conductive interface between the inner electrode member 24 and the backing plate 34. The interface gel 48 provides a thermal and/or electrical path across a gap 86 between the top surface 28 of the inner electrode member 24 and the bottom surface 38 of the backing plate 34. Optionally, the interface gel 48 can also be disposed in a bridged region between the outer electrode member 30 and the backing ring 36. Preferably, a thermally and electrically conductive gasket 46 is disposed between the outer electrode member 30 and the backing ring 36 providing a thermally and electrically conductive path between the outer electrode member 30 and the backing ring 36.

A radio frequency (RF) ring gasket 80 can be located between the inner electrode member 24 and backing plate 34 near the outer periphery of the inner electrode member 24. The backing member 14 contains a plurality of holes 40 adapted to receive fastener members 42 for attaching the backing member 14 to the thermal control plate 16. Preferably, holes 40 and fastener members 42 extend through the thermal control plate 16 and into the backing member 14. The backing plate 34 also includes multiple gas passages 44 extending through the backing plate 34 and in fluid communication with the gas passages 32 in the inner electrode member 24. Optionally, the backing ring 36 also includes multiple gas passages (not shown) extending through the backing ring 36 and in fluid communication with optional gas passages (not shown) in the outer electrode member 30.

The backing plate 34 and backing ring 36 are preferably made of a material that is chemically compatible with process gases used for processing semiconductor substrates in the plasma processing chamber, and is electrically and thermally conductive. Exemplary suitable materials that can be used to make the backing member 14 include aluminum, aluminum alloys, graphite and SiC. A preferred material for backing plate 34 and backing ring 36 is aluminum alloy 6061 which has not been anodized.

In another embodiment (FIG. 1B), the inner electrode member 24 is not bonded to the backing member 14. Instead, a clamp ring 66 secures the inner electrode member 24 to the backing member 14. Preferably, the backing member has a small step at center (not shown) to ensure center thermal contact when clamped from edge. The clamp ring 66 is secured to the backing member 14 by fasteners 68 passing through holes 70 in the clamp ring 66 and attaching to the backing member 14. Preferably, a dielectric ring 67 is disposed between the clamp ring 66 and the inner electrode member 24. In the embodiment illustrated in FIG. 1B, the outer electrode member 30 overlaps the clamp ring 66, fasteners 68 and the outer periphery of the inner electrode member 24 and is attached to the backing member 14 by a bonding material 50. Preferably, the bonding material 50 is a suitable thermally and electrically conductive elastomeric bonding material that accommodates thermal stresses, and transfers heat and electrical energy between the outer electrode member 30 and the backing ring 36. In still another embodiment, the inner electrode member 24 can be attached to the backing member 14 by an elastomeric bonding material and the clamp ring 66, dielectric ring 67 and fastener 68 can be omitted.

The interface gel can be any suitable gel material such as a polymer material compatible with a vacuum environment and resistant to thermal degradation at high temperatures such as above 160° C. The interface gel material can optionally include a filler of electrically and/or thermally conductive particles or other shaped filler such as wire mesh, woven or non-woven conductive fabric. Polymeric gel materials which can be used in plasma environments above 160° C. include polyimide, polyketone, polyetherketone, polyether sulfone, polyethylene terephthalate, fluoroethylene propylene copolymers, cellulose, triacetates and silicone.

The interface gel preferably remains a gel in the showerhead electrode assembly during plasma generation in a plasma processing apparatus. Preferably, the gel has a semi-crosslinked structure to maintain its position in bridged regions. The semi-crosslinked structure while not fully cross-linked (hardened) as in an adhesive, still exhibits more viscosity (stiffness) than a paste which is less viscous than a gel and flows more easily than the gel. In the semi-crosslinked state, the interface gel provides a thermally and/or electrically conductive interface path across a gap 86 between the top surface 28 of the inner electrode member 24 and the bottom surface 38 of the backing plate 34 for the service life of the inner electrode member 24, yet does not adhesively bond the inner electrode member 24 to the backing plate 34. As such, preferably the interface gel fills surface irregularities to provide thermally and/or electrically conductive contact while avoiding bonding the inner electrode member 24 to the backing plate 34, thus allowing separation of the inner electrode member 24 from the backing plate 34 and replacement of the inner electrode member 24 with a new inner electrode member.

Preferably, the interface gel is a thermally conductive semi-crosslinked silicone, thermally bridging an aluminum (Al) backing plate to a single crystal silicon (Si) showerhead upper electrode. In an embodiment, the interface gel preferably comprises a thermally conductive semi-crosslinked silicone based polymer matrix filled with $Al_2O_3$ microspheres. In a preferred embodiment, the interface gel 48 is Lambda Gel COH-4000 (available from Geltec). The contact surfaces of the upper electrode 12, e.g., inner electrode member 24, outer electrode member 30, and backing member 14, e.g., backing plate 34, backing ring 36, each have some degree of roughness caused by processing, e.g., machining. The interface gel material is preferably also soft, tacky sheet-type gel that conducts thermal energy. Preferably, the contact surfaces are polished and clean. The interface gel sheets preferably adhere to surfaces with imperfections or roughness remaining after polishing and drive out air gaps such that the gel compensates for surface roughness of the contact surface and effectively fills regions (e.g., microvoids) of the contact surfaces to enhance thermal and/or electrical contact between the contact surfaces.

The thermally and electrically conductive gasket (interface gasket) 46 preferably comprises a laminate of coaxial annular rings such as a central portion sandwiched between upper and lower portions. For example, the central portion can be a strip of aluminum and the upper and lower portions can be strips of carbon loaded silicone. Alternatively, the interface gasket 46 is a thermal filler material such as a silicone filled with boron nitride (such as CHO-THERM 1671 manufactured by Chomerics), a graphite (such as eGraf 705 manufactured by Graftech), an indium foil, a sandwich (such as Q-pad II by Bergquist), or a phase change material (PCM) (such as T-pcm HP105 by Thermagon).

The thermally and electrically conductive gasket 46 can be, for example, a conductive silicone-aluminum foil sandwich gasket structure, or a elastomer-stainless steel sandwich gasket structure. In a preferred embodiment, the gasket 145 is Bergquist Q-Pad II composite materials available from The Bergquist Company, located in Chanhassen, Minn. These materials comprise aluminum coated on both sides with thermally/electrically conductive rubber. The materials are compatible in vacuum environments. The contact surfaces of the upper electrode 12, e.g., inner electrode member 24, outer electrode member 30, and backing member 14, e.g., backing plate 34, backing ring 36, each have some degree of roughness caused by processing, e.g., machining. The gasket material is preferably also sufficiently compliant so that it compensates for surface roughness of the contact surface and effectively fills regions (e.g., microvoids) of the contact surfaces to enhance thermal contact between the contact surfaces.

Preferably the bridged regions 82 containing interface gel 48 are annular zones. Also, preferably the annular zones are segmented. Preferably the bridged regions are 1 to 12 continuous or segmented annular zones (rings) across the facing surfaces of the inner electrode member 24 and the backing plate 34, for example, 1 to 3 annular zones, 3 to 6 annular zones, 6 to 8 annular zones, 8 to 12 annular zones. FIG. 2 is a top view of the inner electrode member 24, including a plurality of circumferential rows of gas passages 32 extending into a top surface 28. In this embodiment, the interface gel material 48 is applied as annular zone patterns between regions containing gas passages 32. However, the interface gel 48 can be segmented, for example, between regions containing attachment and/or alignment holes 72. While the interface gel 48 is shown as applied in annular zones, the pattern of applying the interface gel is not limited and can be applied in other patterns such as zones which are not annular.

Preferably the electrically and thermally conductive gasket 46 is an annular ring disposed near the periphery of the inner electrode member 24 between the top surface 28 of the inner electrode member 24 and the bottom surface 38 of the backing plate 34. Also preferably, the annular ring gasket 46 is disposed between the outer electrode member 30 and the backing ring 36. Optionally, the interface gel 48 and the electrically and thermally conductive gasket 46 can be layered between the top surface of the upper electrode 12 and the bottom surface of the backing member 14. For example, the interface gel 48 can be on top of the electrically and thermally conductive gasket 46 and/or below the electrically and thermally conductive gasket 46. More than one electrically and thermally conductive gasket 46 may be included in the layer and each electrically and thermally conductive gasket 46 may have interface gel 48 on top of the electrically and thermally conductive gasket 46 and/or below the electrically and thermally conductive gasket 46.

The interface gel can be applied to the top surface 28 of the inner electrode member 24 in a predetermined pattern within application regions (Region A in FIGS. 3A and 3B) of bridging regions (Region AA). In one example, the gel 48 can be applied by rotating inner electrode member 24 about its center point C, and applying the interface gel 48 with a dispenser (e.g., a tube dispenser) by contacting one or more outlets of the dispenser at a single position or multiple radial positions relative to the center point C, generating one or more annular zones at a time. In another example, the predetermined pattern can be applied by covering the top surface 28 of the inner electrode member 24 with a mask having openings in a predetermined pattern. The interface gel can also be applied by wiping, brushing, spraying through the openings of the mask. Examples of mask materials can include KAPTON®, a polyimide-based material, MYLAR®, a polyester-based material, or TEFLON®, a fluoropolymer resin, all available from DU PONT.

In a preferred embodiment, the interface gel is supplied between transfer sheets for handling. Preferably the transfer sheets are TEFLON manufactured by DUPONT. Transfer sheets are preferred to allow, for example, placement of the interface gel on the inner electrode member 24. The interface gel is applied to the application regions (Region A) on the top surface 28 of the inner electrode member 24 by removing one transfer sheet and applying the exposed surface of the interface gel to the top surface 28 (FIGS. 4A and 4B). Preferably, the applied interface gel thickness is from about 0.01 to 0.05 inches thick, more preferably about 0.02 to 0.04 inches thick. The other transfer sheet 52 is removed (FIGS. 5A and 5B) and the bottom surface 38 of the backing plate 34 is applied to the top exposed surface of the interface gel 48 (FIGS. 6A and 6B). The interface gel surface can be tacky and preferably, tooling can be used to precisely remove the transfer sheets and place the sheet of interface gel on the surfaces.

Figure 7A:
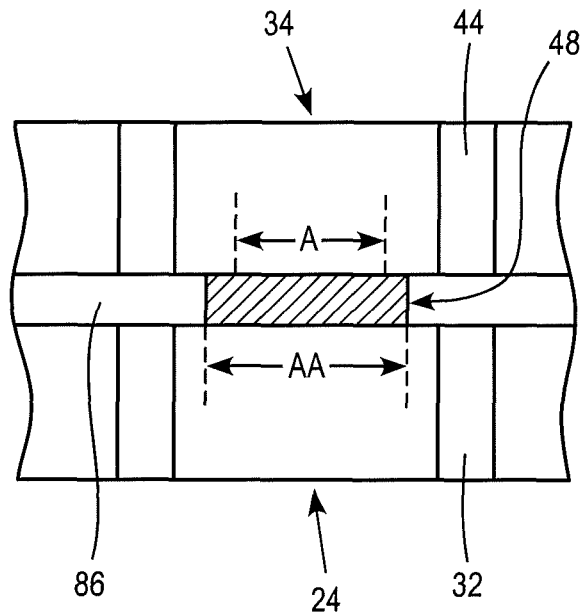
FIGS. 7A and 7B show cross sectional views of embodiments of the interface gel and the interface gel and a thermally and electrically conductive gasket between an upper electrode and a backing member.
Figure 7B:
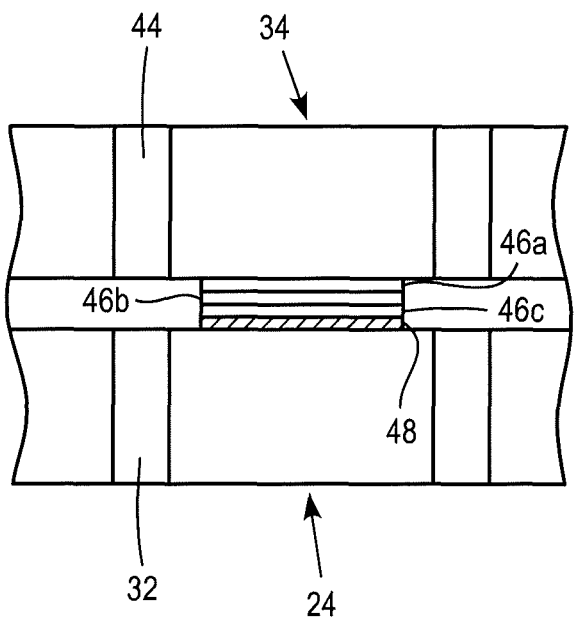

In an embodiment, the interface gel 48 and the electrically and thermally conductive gasket 46 can be layered between the top surface of the upper electrode 12 and the bottom surface of the backing member 14. Preferably, the electrically and thermally conductive gasket 46 thickness is from about 0.005 to 0.05 inches thick, more preferably about 0.008 to 0.02 inches thick, and even more preferably about 0.01 to 0.014 inches thick. For example, FIG. 7A shows a cross section of the interface gel 48 in a bridging region AA between the top surface of the inner electrode member 24 and the bottom surface 38 of the backing plate 34. FIG. 7B shows a cross section example of the interface gel 48 and the electrically and thermally conductive gasket 46 in a bridging region AA between the top surface of the inner electrode member 24 and the bottom surface 38 of the backing plate 34. Preferably, the electrically and thermally conductive gasket 46 includes a laminate of coaxial annular rings such as a central portion 46b sandwiched between upper and lower portions 46a and 46c. For example, the central portion 46b can be a strip of aluminum and the upper and lower portions 46a/46c can be strips of carbon loaded silicone. Preferably, compressibility of the electrically and thermally conductive gasket 46 is limited, requiring significantly higher forces to compress than the interface gel 48. The interface gel 48 preferably compresses easily to establish a thermal interface with minimal contact force. Preferably, as the interface gel is compressed, the thermal resistance decreases. For example, a 0.02 inch thick interface gel compressed 30% at a compression velocity of 0.002 inches/min preferably has a thermal resistance of about 0.06° C./W.

Preferably, in an embodiment wherein the backing plate and electrode are pre-assembled, an alignment fixture (FIGS. 8A-8B) can be used to align the upper electrode 12 and the backing member 14. Also preferably, the inner electrode member 24 and inner backing plate 34 are pressed together and joined with fasteners, clamp rings, adhesive elastomeric bonds or the like. The showerhead electrode assembly can be placed under a vacuum to draw out any gaps or voids under the interface gel and apply a pressing load, such as by vacuum bagging or pressing in the alignment fixture. When the plates 24/34 are pressed together the interface gel spreads laterally to fill the bridged regions (Region AA). Preferably, the interface gel 48 which bridges the gap 86 between the top surface 28 of the inner electrode member 24 and the bottom surface 38 of the backing plate 34 is from about 0.005 to 0.02 inches thick and more preferably from about 0.009 to 0.012 inches thick in the joined showerhead electrode assembly.

Figure 8A:
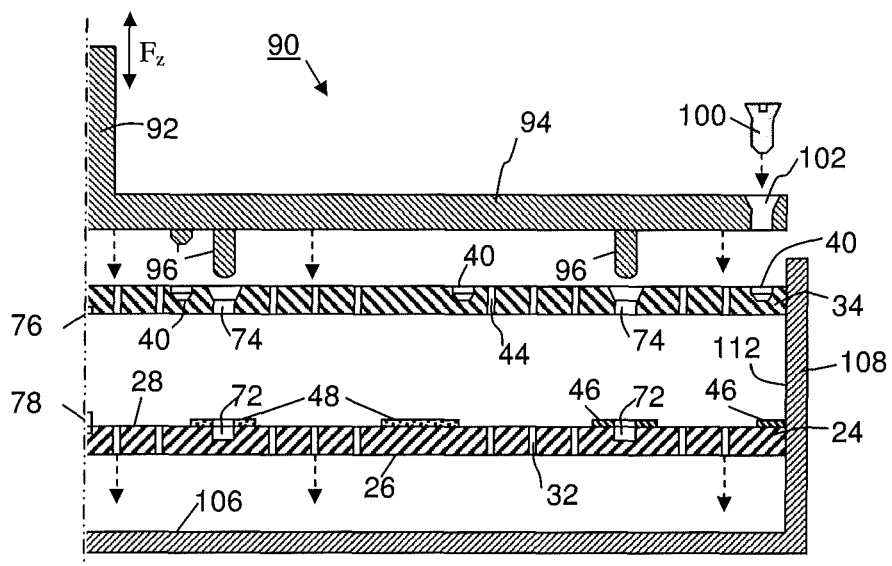
FIGS. 8A and 8B illustrate a cross-sectional view of an embodiment of an alignment fixture and an embodiment of an inner electrode member aligned to a backing plate.
Figure 8B:
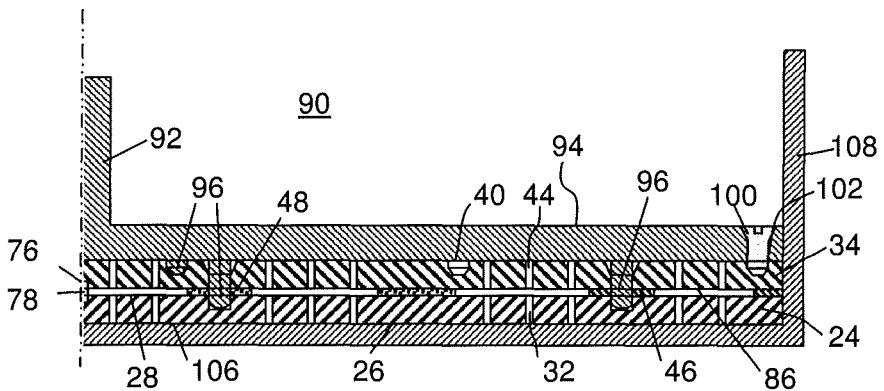

FIGS. 8A and 8B show an embodiment of an alignment fixture 90 to join a backing member 14 to an upper electrode 12 having the interface gel 48 and/or the electrically and thermally conductive gaskets 46 disposed at various locations between the upper electrode 12 and the backing member 14.

In the embodiment shown in FIG. 8A, an upper electrode 12, such as an inner electrode member 24 is positioned on the base 106 of the alignment fixture 90. Optionally, the inner electrode member 24 can be aligned optically on the base by sensing alignment marks (not shown) or the like. The alignment fixture 90 can have an alignment frame 108 to guide the outer periphery of the backing member 14, such as the backing plate 34 onto the inner electrode member 24. A press 94 of the alignment fixture 90 can attach to the top of the backing plate by fasteners 100 through fastener holes 102, suction (not shown) and/or alignment pins 96 to lower the backing plate 34 onto the inner electrode member 24, such that guide pins 78 and/or optional alignment marks in the inner electrode member 24 align with corresponding pin insertion holes 76 and/or optional alignment marks on the backing plate 34. A handle 92 can be automatically or manually operated to move the press 94 in the direction of arrow $F_z$ to press the aligned plates together.

FIG. 8B shows the plates 24/34 aligned with the interface gel 48 and/or thermally and electrically conducting gaskets 46 interposed therebetween. Alignment pins 96 can be inserted in pin alignment holes in the backing plate 34 and the inner electrode member 24 to assist in alignment of the plates.

The press 94 can align the alignment holes 76 and pins 78 on the two plates 24/34 with the interface gel 48 and/or electrically and thermally conductive gaskets 46 disposed in bridged regions between the two plates and press the aligned plates together. Preferably, the plates 24/34 are pressed together for a predetermined time and under a predetermined pressure to spread the interface gel. The plates can then be joined by fasteners, clamp ring, bonding or the like. For example, the backing plate 34 fastener alignment holes 74 that align with holes 72 in the top surface 28 of the inner electrode member 24 receive fasteners (FIG. 1A) to secure the two plates 24/34 together. Optionally, the fasteners can be omitted when an elastomeric adhesive is used to bond the aligned plates. The press 94 of the alignment fixture 90 can be detached from the top of the backing plate by removing fasteners 100, suction or the like. The plates are then removed from the alignment fixture 90. In such an embodiment, the outer electrode member 30 and/or backing ring 36 are installed after the plates 24/34 are removed from the alignment fixture 90. For example, the plates 24/34 can be attached to the thermal control plate 16 in the reaction chamber and the outer backing ring 36 and/or outer electrode 30 attached with fasteners, clamp rings, adhesive elastomeric bonds or the like.

Figure 8C:
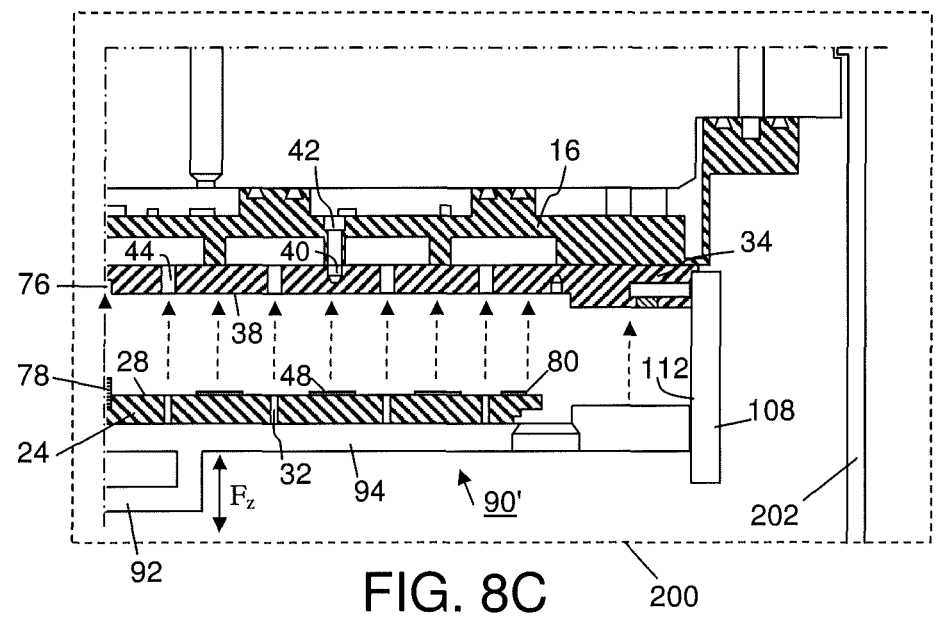
FIGS. 8C and 8D illustrate a cross-sectional view of another embodiment of an alignment fixture and an embodiment of an inner electrode member aligned to a backing plate.

Although in the embodiment shown in FIGS. 8A and 8B the inner electrode member 24 is on the base 106 of the alignment fixture 90 and the backing plate is above the inner electrode member 24, in another embodiment the position of the plates can be inverted if desired. Preferably, the backing plate 34 is attached to a thermal control plate 16 (FIG. 8C) in a plasma reaction chamber 200 having a chamber wall 202 and the alignment frame 90' is used to align the inner electrode member 24 with the backing plate 34. The inner electrode member 24 is then mounted to the backing plate 34 by fasteners, clamp ring, bonding or the like. Preferably, the outer electrode member 30 is installed after the alignment frame 90' is removed from the plates 24/34. Optionally, an alignment frame can be used to align the outer electrode member 30.

Figure 8D:
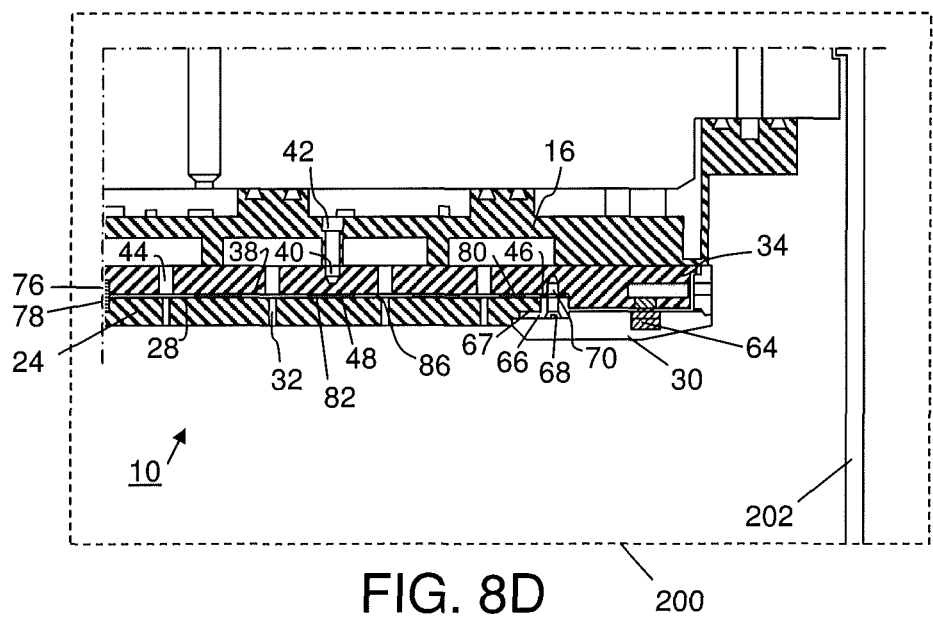

In the embodiment shown in FIG. 8D, a clamp ring 66 secures the inner electrode member 24 to the backing plate 34 after the alignment frame 90' has been removed from the backing plate 34. Optionally, the backing plate 34 has a central step to ensure alignment and improve center thermal contact when inner electrode member 24 is clamped only from its edge. The clamp ring 66 is secured to the backing plate 34 by fasteners 68 passing through holes 70 in the clamp ring 66 and attaching to the backing plate 34. Preferably, a dielectric ring 67 of plastic or other suitable material is disposed between the clamp ring 66 and the inner electrode member 24. In the embodiment illustrated in FIG. 8D, the outer electrode member 30 overlaps the clamp ring 66, fasteners 68 and the outer periphery of the inner electrode member 24 and is attached to the backing plate 34 by cam locks 64. Such cam locks 64 are described, for example, in commonly-owned co-pending U.S. Provisional patent application Ser. No. 12/216,526 filed on Jul. 7, 2008, which is incorporated herein by reference in its entirety.

The above described methods can also be used for applying the interface gel to the bottom surface 38 of the backing plate 34. After the interface gel is applied to at least one of the surfaces, the parts can be assembled such that the surfaces are pressed together under compression, or under a static weight and joined by fasteners, clamp ring, elastomeric adhesive bonds and the like.

During plasma processing, the electrode assemblies comprising the interface gel and/or the electrically and thermally conductive gaskets disposed between the upper electrode and the backing member are able to sustain high operation temperatures, high power densities, and long RF hours.

The interface gel maintains thermal contact between the upper electrode 12 and the backing member 14 when the aluminum backing plate and silicon showerhead thermally expand at different rates due to thermal cycling during processing. Generally, the joint, for example, the clamp ring or elastomeric adhesive, used to attach the upper electrode 12 and backing member 14 together couples the loads between the two parts. However, when the joint is soft (low shear stress at a given strain according to an embodiment), the two parts will not induce stresses or diaphragm deflections into each other. Preferably, the backing plate and showerhead have a gap between non-joined areas of the two mating surfaces to avoid rubbing of surfaces. Diaphragm deflections can cause non-bonded areas of the backing plate surface to contact and rub along non-bonded areas of the showerhead surface during differential thermal expansion of the two parts. Such rubbing can wear particles off of one or both surfaces. However, such a gap is a poor thermal conductor and to reduce the critical dimension variation in substrates during processing, control of the upper electrode temperature is desired. The interface gel provides a thermally conductive path across the gap in bridged regions while allowing the lateral movement of the plates relative to one another.

The interface gel 48 enhances thermal transfer through the bridged regions 82 to better control temperature of the upper electrode 12, such that "first wafer effects" can also be reduced during consecutive processing of a series of wafers. That is, "first wafer effects" refers to secondary heating of subsequent wafers caused indirectly by the heating of the showerhead electrode during processing of the first-processed wafer. Specifically, upon completion of processing of the first wafer, the heated processed wafer and the process chamber side walls radiate heat toward the upper electrode. The upper electrode then indirectly provides a secondary heating mechanism for subsequent wafers that are processed in the chamber. As a result, the first wafer processed by the system may exhibit a larger than desired critical dimension (CD) variation than subsequent wafers processed by the system since wafer temperature variation can affect CD during etching of high aspect ratio contact vias in semiconductor substrates. Subsequently processed wafers may have different and/or less CD variation than the first processed wafer due to stabilization of temperature in the chamber.

Across-wafer and wafer-to-wafer temperature variation can also be preferably reduced by enhancing thermal transfer through the bridged regions 82 with the interface gel 48. Also, chamber-to-chamber temperature matching can be preferably achieved where multiple plasma etching chambers in different processing lines are used for a desired process or throughput, by enhancing thermal transfer through the bridged regions 82.

A one degree Centigrade variation in wafer temperature across-wafer, wafer-to-wafer, or chamber-to-chamber, can cause a CD variation increase at $3\sigma$ ($3\times$ standard deviation) by about 0.5 to 0.1 nm (e.g., 0.4 nm/° C.-0.2 nm/° C. or 0.35 nm/° C.-0.25 nm/° C.).

As mentioned, by using the thermally conductive interface gel 48 in bridged regions 82, after the first wafer has been processed, the temperature of subsequently processed wafers can stabilize, such that temperature variation of reference points on subsequently processed wafers is preferably less than about 10° C., more preferably, less than about 5° C., such that, for example, the CD variation can be controlled to within about 5 nm (0.5 nm/° C.×10° C.), more preferably, to within about 3 nm (0.3 nm/° C.×10° C.), most preferably to within about 0.5 nm (0.1 nm/° C.×5° C.) for etching high aspect ratio contact vias in semiconductor substrates.

For memory applications the CD variation is desirably less than 4 nm at $3\sigma$. With the enhanced thermal transfer through the bridged regions 82 provided by the interface gel 48, the CD variation is preferably, 1 nm or less wafer-to-wafer and 4 nm or less chamber-to-chamber. For logic applications the CD variation is desirably less than 3 nm at $3\sigma$. With the enhanced thermal transfer through the bridged regions 82 provided by the interface gel 48, the CD variation is preferably, 2 nm or less wafer-to-wafer and 4 nm or less chamber-to-chamber.

Preferably, the interface gel 48 minimizes temperature shifts from the center of the electrode to the edge of the electrode by less than 10° C. and minimizes azimuthal temperature shifts to 5° C. or less. Electrode temperature variation due to use of new or used aluminum backing members is related to the contact surface condition of the new and used aluminum backing members. The interface gel 48 preferably can minimize electrode temperature shifts caused by new and used aluminum backing members to less than about 5° C. Also, parts may be removed to be cleaned and it is preferred that a part shows the same thermal performance after such cleaning. The interface gel 48 preferably minimizes thermal performance shifts between before and after cleaning of the aluminum backing members to less than about 5° C. change in electrode temperature.

The interface gel can be formulated purely with low molecular weight dimethyl silicone and optional fillers, or it can also be matrixed around fiberglass screen (scrim), metallic screen, or mixed with glass microbeads and/or nanobeads of glass or other material to accommodate requirements of various applications. Preferably, the interface gel comprises a gel matrix material having a Si—O backbone with methyl groups (siloxane). Preferably, the interface gel is formulated with low molecular weight dimethyl silicone matrixed around $Al_2O_3$ microbeads.

In the case where the interface gel is a thermally and/or electrically conductive gel, the thermally and/or electrically conductive filler material can comprise particles of a thermally and/or electrically conductive metal or metal alloy. A preferred metal for use in the impurity sensitive environment of a plasma reaction chamber is an aluminum alloy, aluminum oxide ($Al_2O_3$), silicon, silicon oxide, silicon carbide, yttria oxide ($Y_2O_3$), graphite, carbon nano tubes, carbon nano particles, silicon nitride (SiN), aluminum nitride (AlN) or boron nitride (BN). Preferably the interface gel is easily compressible, can maintain thermal and/or electrical contact under lateral displacement of the contact surfaces and has a high thermal conductivity. Preferably, the thermal conductivity is from about 0.5 W/mK to 1 W/mK, more preferably from about 1 W/mK to 5 W/mK and most preferably at least 5 W/mK.

The bridged regions can be 1 to 95% of the surface area of the facing surfaces 28/38 of the electrode plate 24 and the backing plate 34. For example, the bridged region can be 1-5%, 5-10%, 10-15%, 15-20%, 20-30%, 30-40%, 40-50%, 50-60%, 60-70%, 70-80%, 80-90%, or 90-95% of the surface area of the facing surfaces 28/38. The gas passage 32/44 openings on the facing surfaces 28/38 are in the unbridged regions and the interface gel thermally bridges the bridged regions.

Also preferably, the backing plate bottom surface 38 is parallel to the electrode top surface 28 with a distance between the two facing surfaces (gap) varying by less than by about +/−25 μm (0.001 in).

The backing plate 34 is attached to thermal control plate 16 by suitable fastener members described for example, in commonly-owned U.S. Patent Application Publication No. 2007/0068629 which is incorporated herein by reference in its entirety. The backing member 34 contains a plurality of holes 40 adapted to receive fastener members 42 for attaching the backing member 34 to a thermal control plate 16.

EXAMPLES

Figure 9:
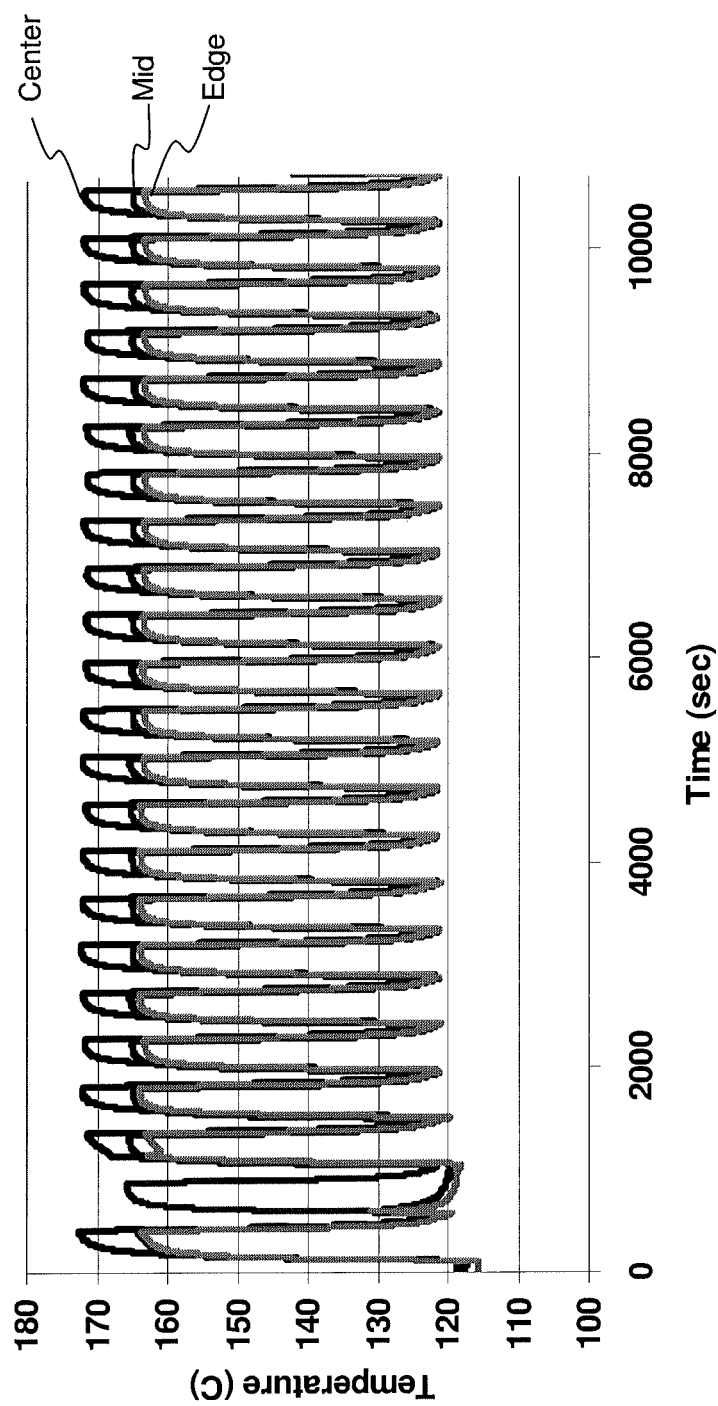
FIG. 9 shows test results for temperature variation across a showerhead electrode assembly including an embodiment of the interface gel and the thermally and electrically conductive gasket during plasma processing of wafers.

Nonlimiting examples are presented of temperature testing of upper silicon showerhead electrodes having the interface gel and the electrically and thermally conductive gaskets disposed between the inner electrode member and the temperature controlled aluminum backing plate during plasma processing runs of wafers. Interface gel was located in two concentric annular bridged zones near the center of the inner electrode member and two concentric annular electrically and thermally conductive gaskets were located near the outer periphery (Example 1). The two concentric annular bridged zones near the center of the inner electrode member were at about r=1.5 inch and about r=3 inch. The two concentric annular electrically and thermally conductive gaskets near the outer periphery were at about r=4.5 inch and about r=6.25 inch. Oxide etching was performed on blanket photoresist wafers. However, any particular type of wafer processing apparatus or system may be adapted for use in any suitable wafer processing systems, including but not limited to those adapted for deposition, oxidation, etching (including dry etching, plasma etching, reactive ion etching (RIE), magnetically enhanced reactive ion etching (MERIE), electron cyclotron resonance (ECR)), or the like. The plasma oxide etch tests were conducted at about 6 kW total power delivered through the bottom electrode at two frequencies of about 2500 W and 27 MHz and about 3500 W and 2 MHz. The chamber pressure was maintained at about 45 mTorr and plasma was formed from process gas flowed into the chamber at about 300 sccm Ar, 18 sccm $C_4F_8$ and 19 sccm of $O_2$. The upper electrode was maintained at a temperature of about 120° C. and the lower electrode was maintained at a temperature of about 20° C. The process time was about 5 min. The electrically and thermally conductive gaskets were 0.012 thick Bergquist Q-pad II. The interface gel was Geltech Lambda Gel COH-4000 applied 0.02 inches thick. During a first process run using the upper silicon showerhead electrode of Example 1, the upper electrode's maximum center to edge temperature difference was 9.5° C. and the upper electrode's maximum center to mid electrode temperature difference was 7.7° C. FIG. 9 shows the test results of the temperature at the upper electrode center (about r=1.5 inch), mid upper electrode (about r=3 inch) and at the upper electrode edge (about r=5 inch) locations during the first run of plasma oxide etching blanket photoresist wafers. The average upper electrode center temperature was 171.75+/−0.75° C. The average mid upper electrode temperature was 165.30+/−0.5° C. and the average edge temperature was 163.50+/−0.5° C. measured during the oxide etch. A wafer fault occurred on the second thermal cycle in the test and the process run was restarted. The data from that fault cycle is shown, but was not used in the calculations.

Figure 10:
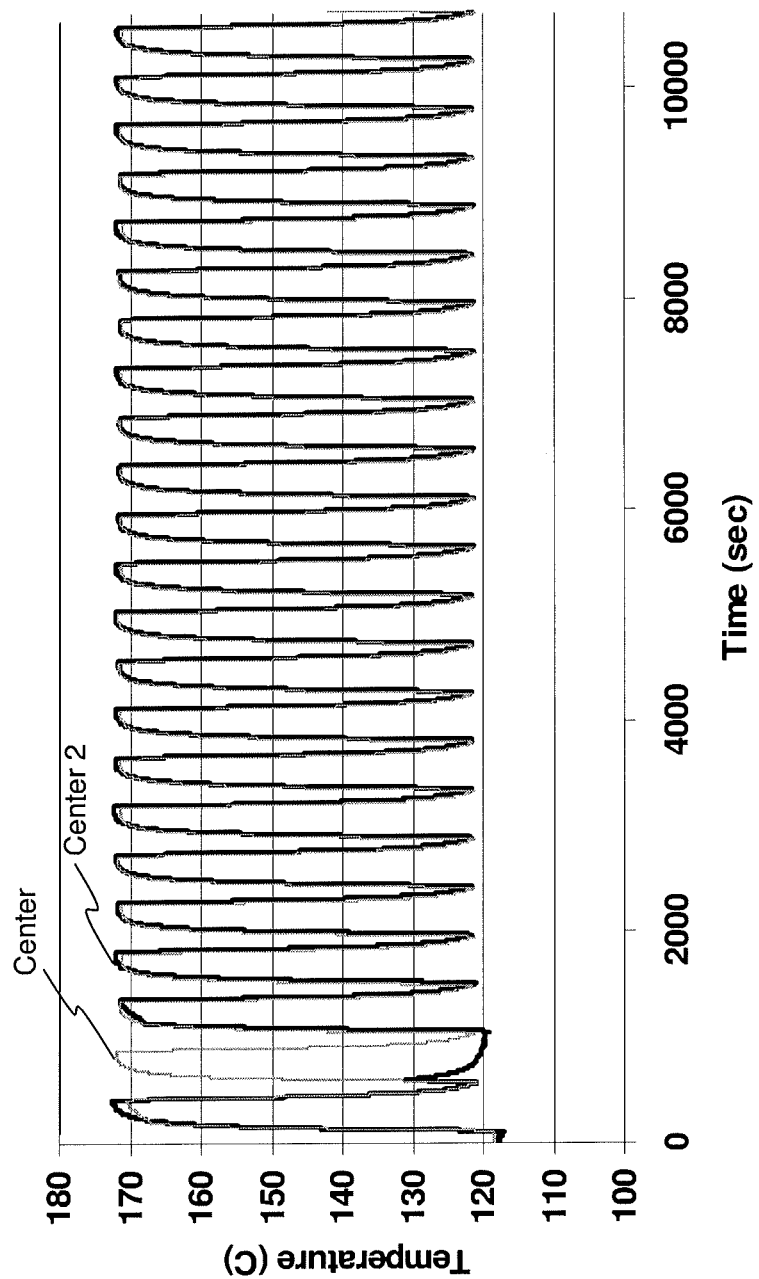
FIG. 10 shows tests results for temperature variation during consecutive processing runs using the showerhead electrode assembly used in the test of FIG. 9.

FIG. 10 shows the temperature repeatability during consecutive process runs at the center of the upper electrode using the showerhead electrode assembly of Example 1. The maximum center to center (during consecutive runs) temperature difference was 1.7° C. The average center temperature of the upper electrode during the first run ("Center") was 171.85+/−0.65° C. and the average during the second run ("Center 2") was 171.35+/−0.55° C.

Figure 11:
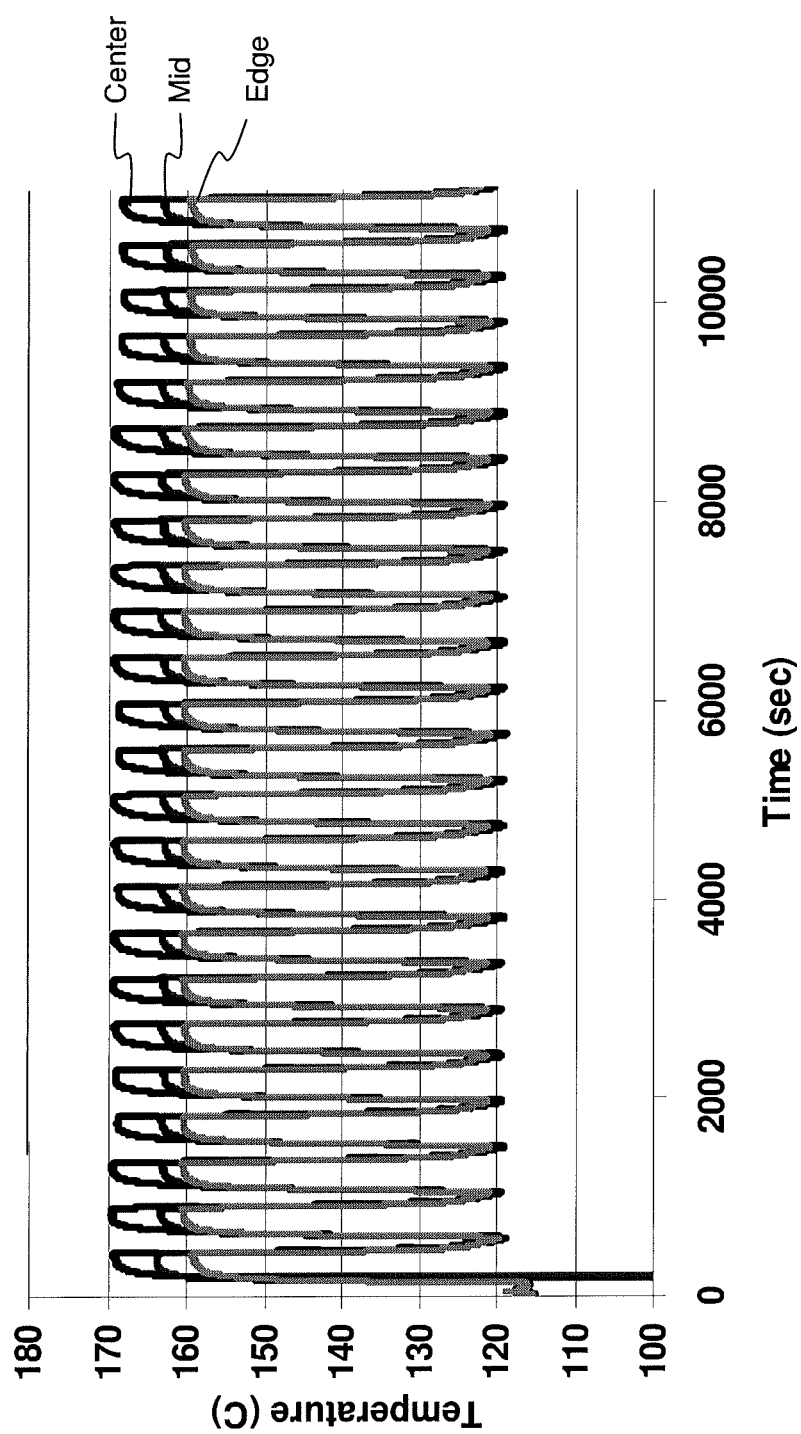
FIG. 11 shows tests results for temperature variation during plasma processing of wafers across an upper electrode of a showerhead electrode assembly used in the test of FIG. 9 after replacement of the interface gel and the thermally and electrically conductive gasket.
Figure 12:
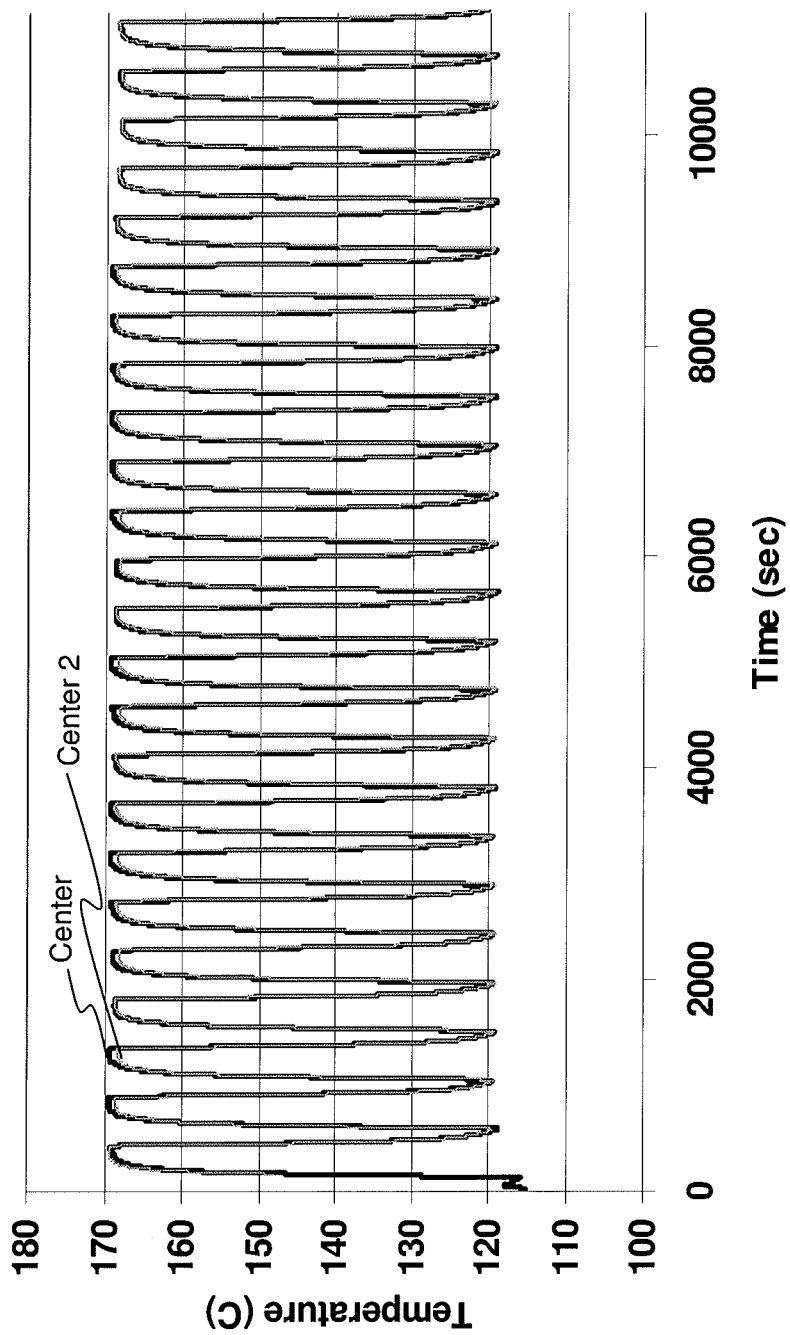
FIG. 12 shows test results for temperature variation during consecutive processing runs using the showerhead electrode assembly used in the test of FIG. 11.

The backing plate 34 was removed from the inner electrode member 24. The interface gel and the electrically and thermally conductive gaskets were replaced with new gel and gasket materials as were used in Example 1 and the showerhead electrode assembly was reassembled for further testing. FIGS. 11 and 12 show temperature variations from test results for across the upper electrode and at the upper electrode center during consecutive process runs with the new gel and gasket materials (Example 2). During a third process run using the upper silicon showerhead electrode of Example 2, the upper electrode's maximum center to edge temperature difference was 10.1° C. and the maximum center to mid electrode temperature difference was 6.8° C. during the oxide etching. The average center temperature ("Center") was 168.85+/−0.65° C. The average mid upper electrode temperature was 163.2+/−0.50° C. and the average edge temperature was 160.05+/−0.65° C. During a fourth oxide etching process run using the upper silicon showerhead electrode of Example 2, average center upper electrode temperature ("Center 2") was 168.65+/−0.65 and the maximum center temperature difference during consecutive runs was 1.5° C. Table 1 summarizes some differences between test results for the two Examples.

TABLE 1

|  | Example 1 (° C.) | Example 2 (° C.) | Difference of average value Example 1 − Ex. 2 (° C.) |
| --- | --- | --- | --- |
| Center | 171.75 +/− 0.75 | 168.85 +/− 0.65 | 2.9 |
| Mid | 165.30 +/− 0.5 | 163.2 +/− 0.5 | 2.1 |
| Edge | 163.50 +/− 0.5 | 160.05 +/− 0.65 | 3.45 |

When the word "about" is used in this specification in connection with a numerical value, it is intended that the associated numerical value include a tolerance of ±10% around the stated numerical value. The terms and phases used herein are not to be interpreted with mathematical or geometric precision, rather geometric terminology is to be interpreted as meaning approximating or similar to the geometric terms and concepts. Terms such as "generally" and "substantially" are intended to encompass both precise meanings of the associated terms and concepts as well as to provide reasonable latitude which is consistent with form, function, and/or meaning.

While the invention has been described in detail with reference to specific embodiments thereof, it will be apparent to those skilled in the art that various changes and modifications can be made, and equivalents employed, without departing from the scope of the appended claims.

What is claimed is:

1. A method of processing a semiconductor substrate in a plasma processing apparatus, the method comprising:
   placing a substrate on a substrate support in a reaction chamber of a plasma processing apparatus;
   introducing a process gas into the reaction chamber with a composite showerhead electrode assembly comprising:
   a backing plate comprising top and bottom surfaces with first gas passages therebetween, the bottom surface having bridged and unbridged regions, the first gas passages having outlets in unbridged regions to supply a process gas to an interior of the plasma processing apparatus;
   an electrode plate having a top surface, a plasma exposed bottom surface, and second gas passages extending therebetween and in fluid communication with the first gas passages, wherein the second gas passages have inlets in unbridged regions of the top surface of the electrode plate; and
   an interface gel disposed between facing surfaces at each of the bridged regions which establishes thermal contact between the electrode plate and the backing plate and maintains the thermal contact during movement in a lateral direction of the electrode plate relative to the backing plate during temperature cycling due to mismatch of coefficients of thermal expansion in the electrode plate and the backing plate; wherein the electrode plate is joined to the backing plate to allow the movement;
   generating a plasma from the process gas in the reaction chamber between the composite showerhead electrode assembly and the substrate;
   processing the substrate with the plasma.

2. The method of claim 1, wherein the interface gel is electrically conductive.

3. The method of claim 1, wherein the electrode plate is joined to the backing plate by a clamping member engaging an outer edge of the electrode plate and resiliently pressing the electrode against the backing plate, wherein a thermally and electrically conductive gasket is interposed between the clamping member and the backing plate.

4. The method of claim 1, wherein the electrode plate is joined to the backing plate by an elastomeric adhesive bond.

5. The method of claim 1, wherein
   the backing plate comprises an inner backing plate and an outer backing ring, the outer backing ring surrounding the inner backing plate, wherein the first gas passages are in the inner backing plate and optionally in the outer backing ring,
   the electrode plate comprises an inner showerhead electrode joined to the inner backing plate and an outer ring electrode joined to the outer backing ring, wherein the second gas passages are in the inner showerhead electrode and optionally in the outer ring electrode.

6. The method of claim 5, wherein (a) the surfaces of the inner backing plate and showerhead electrode facing one another are parallel to each other and/or (b) the electrode plate is of single crystal silicon, polycrystalline silicon, graphite or silicon carbide; and the backing plate is of aluminum, graphite, or silicon carbide.

7. The method of claim 1, further comprising at least one thermally and electrically conductive gasket disposed between the electrode plate and backing plate surfaces in at least one bridged region.

8. The method of claim 7, wherein the interface gel comprises first and second continuous or segmented rings between facing surfaces at two inner bridged regions and the at least one thermally and electrically conductive gasket comprises first and second continuous or segmented rings between the facing surfaces at two outer bridged regions.

9. The method of claim 7, wherein the at least one thermally and electrically conductive gasket comprises two or more laminated layers having different physical properties.

10. The method of claim 7, wherein at least one portion of the interface gel and the at least one thermally and electrically conductive gasket has a thermal conductivity between the electrode plate and backing plate surfaces of 0.5 W/mK to 1 W/mK, 1 W/mK to 5 W/mK and/or over 5 W/mK.

11. The method of claim 1, wherein the interface gel comprises a silicone based composite, a low molecular weight siloxane and a uniform distribution of thermally conductive filler, or a combination thereof.

12. The method of claim 11, wherein the thermally conductive filler is one of boron nitride (BN), aluminum oxide ($Al_2O_3$), silicon, silicon carbide, and a combination thereof.

13. The method of claim 1, wherein a gap distance between the bridged regions of facing surfaces of the backing plate and electrode plate varies by less than ±25 µm (0.001 in).

14. The method of claim 1, wherein
(a) the interface gel is a sheet material;
(a) the bridged regions comprise: 1 to 3 continuous or segmented annular zones, 3 to 6 continuous or segmented annular zones, 6 to 8 continuous or segmented annular zones, or 8 to 12 continuous or segmented annular zones; and/or
(b) the bridged regions comprise: 1-5%, 5-10%, 10-15%, 15-20%, 20-30%, 30-40%, 40-50%, 50-60%, 60-70%, 70-80%, 80-90%, or 90-95% of the surface area of the facing surfaces of the electrode plate and the backing plate.

15. The method of claim 1, wherein the processing comprises plasma etching the substrate.

* * * * *